United States Patent [19]

Mendel et al.

[11] Patent Number: 5,097,200
[45] Date of Patent: Mar. 17, 1992

[54] ELECTRON LAUNCHING VOLTAGE MONITOR

[75] Inventors: Clifford W. Mendel; Mark E. Savage, both of Albuquerque, N. Mex.

[73] Assignee: The United States of America as represented by the United States Department of Energy, Washington, D.C.

[21] Appl. No.: 612,283

[22] Filed: Nov. 9, 1990

[51] Int. Cl.$^5$ .............................................. G01N 27/62
[52] U.S. Cl. ..................................... 324/71.3; 324/72; 324/72.5
[58] Field of Search ..................... 324/72, 72.5, 71.3; 313/231.01, 157; 315/111.21

[56] References Cited

U.S. PATENT DOCUMENTS

| | | | |
|---|---|---|---|
| 4,629,975 | 12/1986 | Fiorito et al. | 324/71.3 |
| 4,727,298 | 2/1988 | Mendel | 313/157 |
| 4,812,715 | 3/1989 | Mendel | 313/157 X |

OTHER PUBLICATIONS

C. W. Mendel, Jr. et al., "A Simple Theory of Magnetic Insulation from Basic Physical Consideration", Laser and Particle Beams, vol. 1 part 3, pp. 311-320, 3-1983.
P. A. Miller and C. W. Mendel, Jr., "Analytic Model of Applied-B Ion Diode Impedance Behavior", J. Appl. Phys. 61(2), Jan. 15, 1987, pp. 529-539.

Primary Examiner—Jack B. Harvey
Attorney, Agent, or Firm—George H. Libman

[57] ABSTRACT

An electron launching voltage monitor measures MITL voltage using a relationship between anode electric field and electron current launched from a cathode-mounted perturbation. An electron launching probe extends through and is spaced from the edge of an opening in a first MITL conductor, one end of the launching probe being in the gap between the MITL conductor, the other end being adjacent a first side of the first conductor away from the second conductor. A housing surrounds the launching probe and electrically connects the first side of the first conductor to the other end of the launching probe. A detector detects the current passing through the housing to the launching probe, the detected current being representative of the voltage between the conductors.

6 Claims, 3 Drawing Sheets

ELECTRON LAUNCHING VOLTAGE MONITOR

The United States Government has rights in this invention pursuant to Contract No. DE-AC04-76DP00789 between the Department of Energy and American Telephone and Telegraph Company.

BACKGROUND OF THE INVENTION

This invention relates generally to a voltage monitor for a magnetically insulated transmission line (MITL), and more particularly to a probe for monitoring MITL voltage as a function of probe current.

Voltage is a very important parameter for the operation of a Terawatt class pulser. For example, a voltage measurement is crucial to the study of pulser power flow and time-dependent load behavior. In addition, a voltage measurement near a MITL load reduces the magnitude of the inductive voltage correction needed to determine the voltage at the load. Furthermore, if voltage is measured in the water section of the pulser, voltage corrections from the water section to the load are affected by the vacuum insulator stack region, which region often supports non-TEM waves, and by insulators that may partially flash and the ultimately short completely during a power pulse. The erratic behavior of a highly stressed insulator is a severe hindrance to accurately extrapolating voltage measured in the water to the voltage at the load.

This load voltage has proven extremely difficult to measure accurately. Ideally, a purely electrical diagnostic can provide good resolution with a single data channel. Standard electrical techniques are the inductive voltage monitor, resistive dividers, electro-optical devices, and capacitive monitors. Each of these has some significant disadvantages.

The inductive voltage monitor shunts the transmission line with an inductor of known value, and the rate of change of magnetic flux is measured. This technique can be used in vacuum, and provides large signal levels. The problem is the power flow disruption that results from this current shunt. First, the current in the inductor rises with the integral of the voltage across it, which means that current loss increases as the power pulse progresses. The measuring inductor's resulting falling ratio of voltage-to-current can excessively load the pulser late in the power pulse. A higher inductance monitor lessens this loss, but it requires a physically larger inductor which, in turn, inhibits high-frequency response because of transit-time effects. The second major problem with the inductive divider in a MITL is the electron loss resulting from the magnetic null if the monitor bifurcates the power flow, as it usually does. The magnetic null is created because the monitor must be self-magnetically insulated, and downstream of the monitor this magnetic field is oppositely directed from the main MITL field. Therefore, there must be a magnetic null at some point downstream of the monitor. Electron losses at this null can be substantial.

Resistive dividers have been used in vacuum, but flashover of the resistor surface due to the high voltage and electron bombardment is an overwhelming problem at voltages exceeding a few MV in low impedance systems.

Electro-optical electric field measurement techniques offer the advantage of immunity to electrical noise. This technique has been used to measure voltage in the water section of a TW pulser, but the problem of radiation scintillation in fiber-optic cables (from X-rays, electrons, ions, and neutrons) has hindered the application of this technique to the vacuum section of TW pulsers.

Capacitive voltage monitors are commonly used in the oil and water sections of large pulsers. Capacitive probes function well in oil and water, as long as there is no breakdown in the dielectric liquid which would distort the electric field. There are two serious practical concerns in using capacitive monitors in a MITL. The first is that the cathode electric field in a MITL is essentially zero. Therefore, the probe must be placed in the anode where the probe and associated signal cabling are subject to energetic electron bombardment, a problem because complete shielding for signal cables is difficult for MeV electrons. The second concern is the small signal level of the displacement current signal, and the fact that the displacement current collector itself will also collect electron charge. A MITL has an electron loss front during the beginning of the power pulse, and upstream perturbations can launch unstable flows that reach the anode throughout the power pulse. Though these losses are typically small compared to the current delivered to the load, the electron loss current can dominate the displacement current collected by the capacitive monitor.

A high-B field vacuum capacitive voltage monitor has also been developed. The construction of this monitor is quite complicated, and it is quite sensitive to poor vacuum because its magnetic field configuration can retain ionizing electrons.

Voltage can also be determined knowing anode and cathode currents, and the vacuum impedance of the MITL. This has been done on systems where the vacuum electron flow is a substantial fraction of total current, such as 20% or greater. However, since efficient systems have a minimum vacuum electron flow, usually less than 3%, the measurement is difficult because the voltage is computed from the difference in anode and cathode currents.

SUMMARY OF THE INVENTION

It is an object of this invention to provide a voltage monitor for a MITL that directly measures vacuum electron flow from a probe.

It is another object of this invention to provide a voltage monitor for a MITL that has a large signal level, tolerance to poor vacuum, and nanosecond temporal response.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a voltage monitor for a magnetically insulated transmission line including an electron launching probe extending through and spaced from the edge of an opening in a first MITL conductor, one end of the launching probe being in the gap between the MITL conductors, the other end being adjacent a first side of the first conductor away from the second conductor. A housing surrounds the launching probe and electrically connects the first side of the first conductor to the other end of the launching probe. A detector detects the current passing through the housing to the launching probe, the detected current being representative of the voltage between the conductors.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

Figure 1:
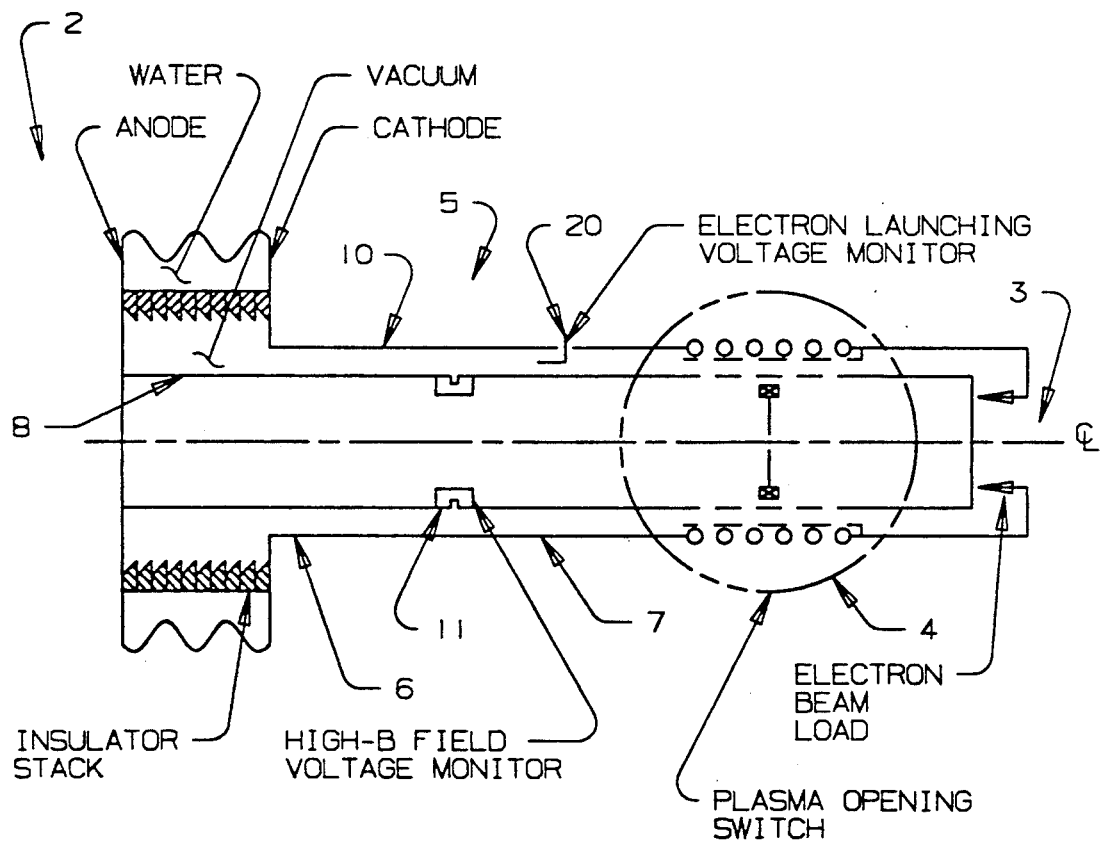
FIG. 1 shows a sectional drawing of a source, MITL, and load.

FIG. 1 shows a magnetically insulated transmission line 5 consisting of a coaxial outer first cathode conductor 10 and an inner second anode conductor 8. A very high voltage, short duration, pulse generator 2 such as SuperMite, a 2.2Ω, 800 kA generator at Sandia National Laboratories, is connected to a source end 6 of MITL 5; a load 3 is connected to load end 7 of MITL 5. A plasma opening switch 4, such as disclosed in U.S. Pat. No. 4,727,298 of C. Mendel, controls the application of power from generator 2 to load 3. An electron launching voltage monitor 20, in accordance with a preferred embodiment of the invention, is affixed to MITL 5 to monitor the voltage across vacuum gap 9 between conductors 8 and 10. A high-B field voltage monitor 11 is also included in MITL 5 for comparison purposes with monitor 20.

The operation of MITL 5 is as follows: Generator 2 is connected so a positive pulse is applied to inner conductor 8 with respect to outer conductor 10. Electrons emitted from the MITL cathode 10 are prevented from crossing the vacuum gap 9 by a transverse magnetic field arising from self-current flowing in the MITL. This magnetic field is strong enough to cause the electrons to move in cycloidal orbits which do not reach anode 8, thereby preventing power loss caused by electron flow across gap 9. Magnetically insulated power flow has been demonstrated at voltages ranging from 0.1 to 16 MeV.

The general equation for voltage in a low impedance MITL has been shown by P. Miller and coinventor C. Mendel (J. Appl. Phys, 61, 529 (1987)) to be equal to the product of the anode electric field times the gap distance less a correction for electron space discharge in the gap. For a MITL with vacuum impedance $Z_O$, anode current $I_a$, and cathode current $I_c$, when vacuum electron flow is small compared to the anode current, the space charge correction term is small and voltage is approximately:

$$V \approx Z_0(I_a^2 - I_c^2)^{\frac{1}{2}} \quad (1)$$

Relating voltage to currents is important for this invention because current measurements are easier to make than voltage measurement, as current probes are low impedance and easier to protect from electron collection.

The low space charge electron flow is desirable from an efficiency standpoint as it means that most current is flowing to the load along the conductors. Although electron flow in the gap reaches the load, it cannot be used by many loads. However, using this relation to measure voltage requires taking the difference of two large numbers that are very close in value. An advantage of the invention is that it measures this difference directly.

Figure 2:
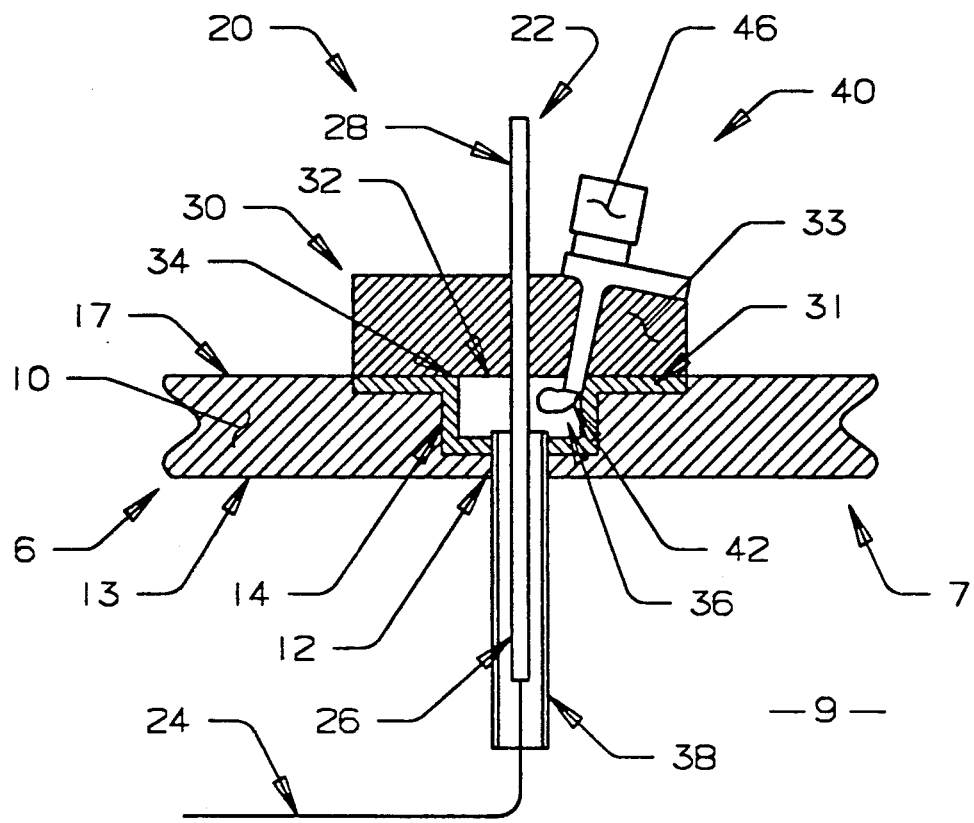
FIG. 2 is a sectional drawing of the invention.
Figure 3:
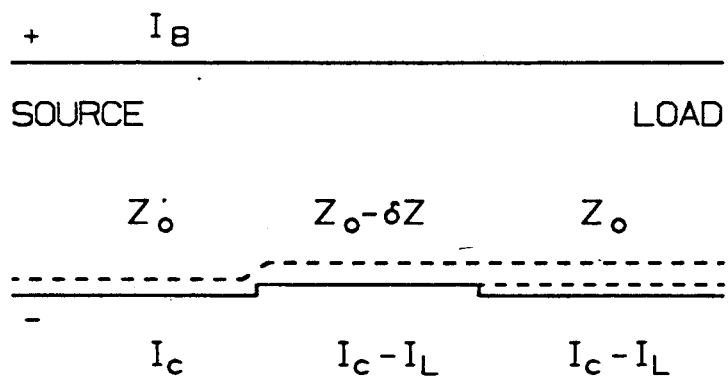
FIG. 3 is a schematic representation of a MITL with a perturbation.

The operation of the invention may be understood with reference to FIG. 3, which figure shows a planar MITL with a two-dimensional perturbation in the cathode. Since the voltage is constant throughout the MITL and the impedance has decreased with the smaller gap, equation (1) shows that the gap current flow ($I_a-I_c$) must increase. For the perturbation δZ in FIG. 2, assuming low gap electron flow (small perturbation), the voltage may be calculated as:

$$V \approx \left( \frac{Z_0^2(Z_0 - \delta Z)}{\delta Z} \right)^{\frac{1}{2}} (I_c I_l)^{\frac{1}{2}} \quad (2)$$

$$= Z_g (I_c I_l)^{\frac{1}{2}} \quad (3)$$

where $I_l$ is the electron current launched by the perturbation. These equations show that gap voltage is related to the current launched by the perturbation and the total cathode current by a constant factor that is geometry dependent. This factor, $Z_g$, is called gauge impedance.

A three-dimensional perturbation should exhibit the same type behavior, but with a modified geometric calibration factor. The three-dimensional perturbation used in this invention, a small wire probe, is advantageous because the current in a single wire is easily measured, the electron loss is relatively small, and a small diameter wire has enormous field enhancement and, therefore, emits electrons at a relatively low voltage.

As shown in FIG. 2, monitor 20 consists of three components; a probe 22, a housing 30, and a detector 40.

Probe 22 extends through a hole 12 in outer conductor 10. One end 24 of probe 22 is spaced in gap 9 between conductors 8 and 10; the other end 28 extends above the outer surface 17 of conductor 10. The middle portion 26 of probe 22 is spaced from the edge of hole 12 to prevent electron conduction directly from the edge of hole 12 to middle portion 26. A shield 38 extending from hole 12 may also be provided as discussed hereinafter.

Housing 30 has a wall 32 extending from portion 28 of probe 22 at a location spaced from first surface 17 to first surface 17 at another location 34 spaced from opening 12. Wall 32 and first surface 17 thereby define a volume 36 adjacent opening 12.

Detector 40 consists of an inductive loop 42 in volume 36 oriented to couple to the magnetic field resulting from passage of current through probe 22. The ends of loop 42 are connected to the coaxial terminals of a conventional connector 46 mounted to housing 30. In operation, the voltage induced in inductive loop 42 is detected by a detecting instrument such as an oscilloscope connected to connector 46.

As shown in FIG. 2, the preferred embodiment of housing 30 includes an upper part 33 defining wall 32 extending in the plane of first surface 17. A lower part 31 is recessed in an opening 14 larger than and coaxial with opening 12 and extending from the surface 17 of conductor 10. The upper end of shield 38 is fastened to lower part 31. This construction provides access to volume 36 for connection of loop 42.

The operation of the invention is as follows: When a high voltage source is coupled to MITL 10, the very high positive voltage on anode 8 begins to draw electrons from the surface of probe 22, the perturbation of FIG. 3. These moving electrons define a current path that is confined to the exterior of each conductor surface by the skin effect. This path extends along probe 22 to wall 32 and first surface 17. The current then passes from surface 17 to the inside of shield 38 where it passes around the shield's opposite end and returns along the outside to inside surface 13 of conductor 10. By following this path the electrons induce a voltage in loop 42 which is detected by the detecting instrument.

Shield 38 also prevents the collection on probe 22 of electrons launched upstream of the monitor along MITL 10.

An embodiment built in accordance with FIG. 2 used a two turn inductive loop 42. Except as noted, the remainder of the construction was brass. Cavity 36 had an inside diameter of 14 millimeters (0.56 inches) and a height of 5.6 mm (0.22 in). Shield 38 had a length of 20 millimeters (0.8 inches), an outside diameter of 5 mm (0.2 in), and a wall thickness of 0.25 mm (0.01 in). The middle portion 26 and other end 28 of probe 22 was a 70 mm (2.75 in) long, 1.6 mm (0.06 in) diameter rod. First end 24 was a 60 mm (2.4 in) length of 0.3 mm (0.012 in) steel music wire. Middle portion 26 of probe 22 makes a sliding fit within housing 30 so that the position of first end 24 may be adjusted. For the results reported, the probe position was halfway across the 50 mm (2 in) gap between electrodes 8 and 10. First end 24 was aimed upstream to allow the reversed electric field on the cathode side of wire 24 to deflect electrons flowing near inner surface 13 away from shield 38.

Figure 4:
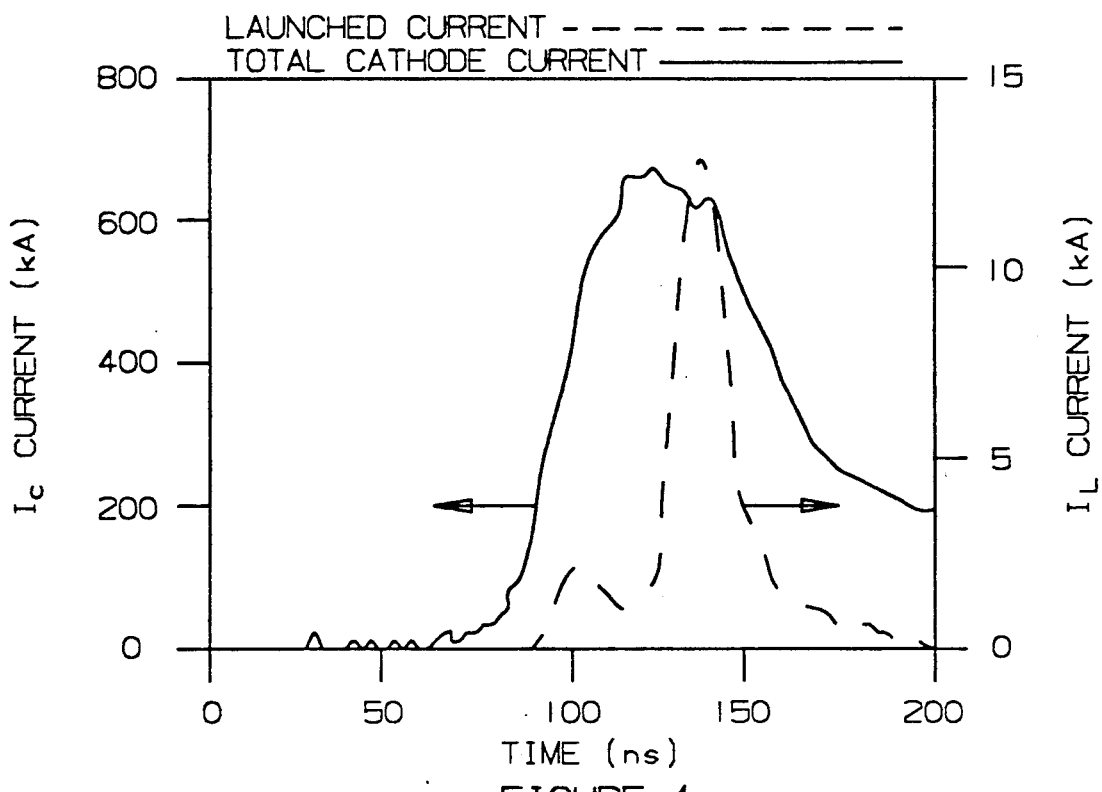
FIG. 4 shows current measurements of a MITL.
Figure 5:
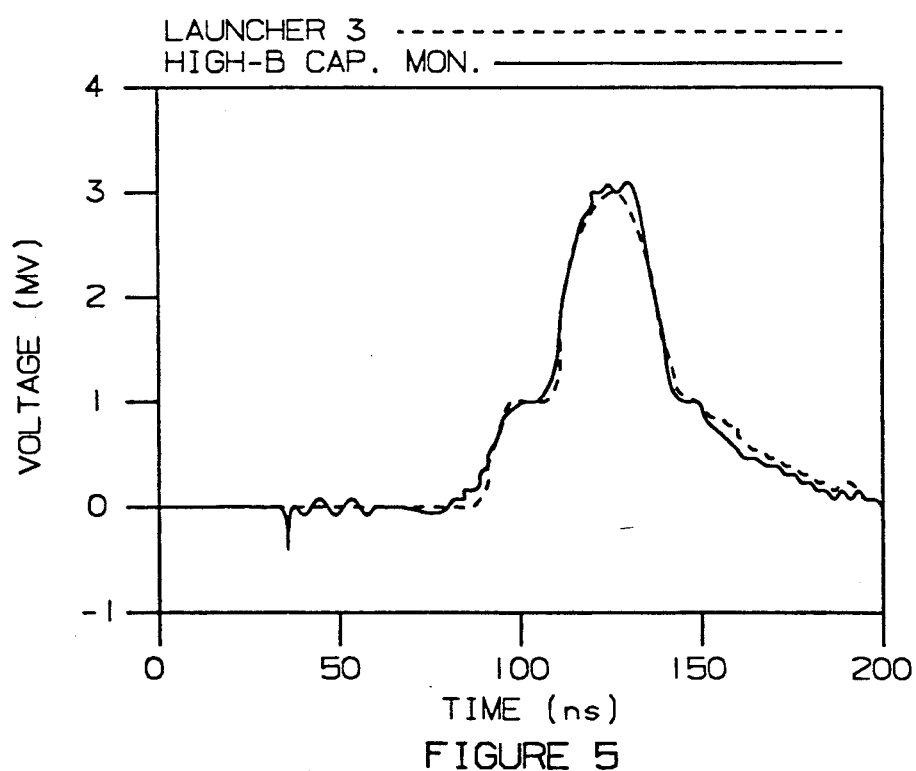
FIG. 5 shows calculated measurements from the current measurements of FIG. 4.

FIG. 4 shows the currents during a typical MITL shot using a plasma opening switch. The peak cathode current, $I_c$, seen to be on the order of 700 kA; the peak launched current, $I_1$, across the gap is seen to be on the order of 15 kA. Since the launched current is only about 2% of the total cathode current, equation 3 may be solved to yield the voltage signal of FIG. 5. In this figure the computed voltage is overlayed with a measured voltage by High-B Field capacitive voltage monitor 11. The gauge impedance used for the calculation was determined from comparison to capacitive monitors, and from inductive voltage at the launcher while plasma opening switch 4 was closed. (The monitor of the invention could also be normalized to a peak-reading, non-time-resolved voltage diagnostic). Once the gauge impedance was determined (from a short circuit shot, for example) that calibration was valid for subsequent shots unless the geometry was changed. The typical gauge impedance was 31Ω.

The MITL during this test was at a vacuum of approximately $3 \times 10^{-5}$ Torr.

The agreement between the monitors is within the accuracy expected due to azimuthal variations in the MITL. Note also there is no "turn-on delay" for the launcher monitor; and it has emitted electrons at MITL potentials of 100 kV or less.

The particular sizes and equipment discussed above are cited merely to illustrate a particular embodiment of this invention. It is contemplated that the use of the invention may involve components having different sizes and shapes as long as the principle of putting a perturbation in the line to cause a small gap electron flow to be launched, and measuring the launched current to determine line voltage, is followed. For example, first surface 17 could be planar at hole 12 with volume 36 located above the plane of surface 17. In addition, either conductor of MITL 5 may be negatively charged; the invention would be affixed to that conductor. Also, portion 28 of probe 22 needs to extend only to make electrical contact with housing 30; it was extended through housing 30 in the disclosed embodiment to allow for adjustment of the position of first end 24 within gap 9. It is intended that the scope of the invention be defined by the claims appended hereto.

We claim:

1. A voltage monitor for a magnetically insulated transmission line having two spaced conductors extending from a source end to a load end, said conductors being separated by a gap, wherein the negative pole of a source is connected to a first conductor and the positive pole of the source is connected to a second conductor, said monitor comprising:

electron launching means extending through and spaced from the edge of an opening in said first conductor, a first end of said launching means being in said gap, the other end being adjacent a first side of said first conductor away from said second conductor;

housing means surrounding said launching means and electrically connecting said first side of said first conductor to said other end of said launching means; and detector means for detecting the current passing through said housing from said launching means;

whereby a high voltage pulse applied to the source of said transmission line causes electrons to be launched from said first end of said launching means to said second conductor, said electrons causing said current to flow through said housing, said detected current being related to the voltage between said conductors.

2. The voltage monitor of claim 1 wherein said first end of said launching means extends parallel to said second conductor.

3. The voltage monitor of claim 2 wherein said first end of said launching means points towards said source end of said line.

4. The voltage monitor of claim 1 wherein said first end of said launching means is approximately half way between said conductors.

5. The voltage monitor of claim 1 wherein said housing means has an wall extending from said launching means at a location spaced from said first side to said first side at a location spaced from said opening thereby defining a volume adjacent said opening, whereby said current flows from said launching means through said housing to said first conductor.

6. The voltage monitor of claim 5 wherein said detector means comprises an inductive loop within said volume defined by said housing, said loop being oriented to couple to the magnetic field caused by current passing through said housing and launching means.

* * * * *